United States Patent
Miyaura

(10) Patent No.: US 6,208,217 B1
(45) Date of Patent: *Mar. 27, 2001

(54) ASK MODULATOR WITH FREQUENCY DEPENDENT VOLTAGE DIVIDER

(75) Inventor: Masao Miyaura, Fukushima-ken (JP)

(73) Assignee: Alps Electric Co., Ltd., Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/129,504

(22) Filed: Aug. 5, 1998

(30) Foreign Application Priority Data

Aug. 5, 1997 (JP) .................................. 9-210711

(51) Int. Cl.$^7$ .................................. H04L 27/04
(52) U.S. Cl. .................... 332/152; 332/155; 332/161; 332/159; 332/115; 375/320
(58) Field of Search ................. 332/149, 152, 332/155, 161, 159, 115; 375/254, 320

(56) References Cited

U.S. PATENT DOCUMENTS

| | | |
|---|---|---|
| 3,271,701 | 9/1966 | Racy . |
| 3,404,354 | 10/1968 | Verlinden . |
| 3,582,828 | * 6/1971 | Brockman . |
| 4,266,201 | 5/1981 | Belfatto . |
| 4,352,029 | 9/1982 | Mahoney et al. . |

FOREIGN PATENT DOCUMENTS

| | | |
|---|---|---|
| 57-202165 | 10/1982 | (JP) . |
| 07212415A | 1/1994 | (JP) . |
| 09121231A | 10/1995 | (JP) . |

* cited by examiner

Primary Examiner—Arnold Kinkead
(74) Attorney, Agent, or Firm—Brinks Hofer Gilson & Lione

(57) ABSTRACT

An ASK modulator including a switching diode connected in series to a carrier signal transmitting path, a first resistor connected between one end of the switching diode and a digital signal input end and a second resistor connected between one end of the switching diode and the reference voltage point. The digital signal to be applied to the digital signal input end is divided by the first and second resistors and the switching diode is turned ON and OFF to generate the ASK modulated signal with the logical level of the divided digital signal. In this case, the switching level of the switching diode rises substantially to prevent that the switching diode turns ON by the ringing phenomenon.

4 Claims, 2 Drawing Sheets

ASK MODULATOR WITH FREQUENCY DEPENDENT VOLTAGE DIVIDER

BACKGROUND OF THE INVENTION

1. Field of the Invention

The present invention relates to an ASK modulator and more particularly to an ASK modulator which intermits a carrier signal to be transmitted to generate an ASK modulated signal by turning ON and OFF a switching element for transmitting the carrier signal depending on the logical level of a digital signal.

2. Description of the Related Art

In the typical one of the ASK modulator to generate an ASK modulated signal, the ASK modulated signal can be obtained at the other end of a switching diode by connecting in series a switching diode to a carrier signal transmission path, supplying both carrier signal and digital signal to one end of the switching diode, transmitting the digital signal by turning ON the switching diode when the digital signal is in a logical high level and rejecting transmission of the digital signal by turning OFF the switching diode when the digital signal is in a logical low level.

Here, FIG. 3 is a circuit diagram showing an example of the structure of the ASK modulator of the related art as explained above.

As shown in FIG. 3, an ASK modulator comprises a switching diode 21, a first coupling capacitor 25 connected in series between one end (input end) of the switching diode 21 and a carrier signal input end 27, a current limiting resistor 24 and a first choke coil 22 for rejecting a higher frequency signal connected in series between one end of the switching diode 21 and the digital signal input end 29, a second choke coil 23 for rejecting a higher frequency signal connected between the other end (output end) of the switching diode 21 and the ground point and a second coupling capacitor 26 connected in series between the other end of the switching diode 21 and the ASK modulated signal output end 28.

The ASK modulator of the structure explained above operates as explained below.

To the carrier signal input end 27, a carrier signal is supplied, while to the digital signal input end 29, a digital signal, which changes between the logical high level (as this level, a voltage level, for example 5 V, which is higher than 0.7 V indicating a voltage drop in the forward direction of the switching diode 21, is selected) and the logical low level (as this level, a voltage level, for example 0 V, which is lower than 0.7 V indicating a voltage drop in the forward direction of the switching diode 21, is selected).

When the digital signal supplied to the digital signal input end 29 is in the logical high level, such the logical high level signal flows to the ground point from the digital signal input end 29 via the current limiting resistor 24, the first choke coil 22, the switching diode 21 and the second choke coil 23 to turn ON the switching diode 21. Therefore, the carrier signal supplied to the carrier signal input end 27 is transferred to the ASK modulated signal output end 28 via the first coupling capacitor 25, the switching diode 21 and the second coupling capacitor 26.

Meanwhile, when the digital signal supplied to the digital signal input end 29 changes to the logical low level signal, this logical low level signal becomes almost equal to the ground potential and thereby voltages at both ends of the switching diode 21 become equal to each other to turn OFF the switching diode 21. Therefore, the carrier signal supplied to the carrier signal input end 27 is rejected to be transferred by the switching diode 21. As a result, it is not transferred to the ASK modulated signal output end 28.

As explained above, the switching diode 21 shifts to ON or OFF state to transmit the carrier signal or reject transmission thereof as the digital signal to shift to the logical high level or the logical low level. Therefore, the ASK modulated signal in which the carrier signal is intermitted can be output from the ASK modulated signal output end 28.

The ASK modulator of the related art explained previously generates a ringing phenomenon in which the shifted logical low level changes in the high and low direction within the short period immediately after the change in the digital signal from the logical high level to the logical low level.

FIG. 4 is a characteristic diagram showing the relationship between the ringing phenomenon generating condition and the switching level when the digital signal changes to the logical low level from the logical high level in the ASK modulator of the related art.

In FIG. 4, the signal level is plotted on the vertical axis, the time on the horizontal axis, a solid line indicates the level changing condition of the digital signal supplied to the digital signal input end 29 (almost equal to the level changing condition of the digital signal supplied to the input end of the switching diode 21), and a chain line (phantom line) indicates the switching level of the switching diode 21, here, equal to a voltage drop in the forward direction of the switching diode 21.

As indicated by a solid line in FIG. 4, when the digital signal changes from the logical high level to the logical low level, the logical low level of the digital signal shows, immediately after such level change, variation of level in the high and low direction within a short period of time. When the time passes, such level variation becomes small, generating the ringing phenomenon which is converted to the logical low level. When level variation due to this ringing phenomenon is large, the logical low level of the digital signal supplied to the input end of the switching diode 21 exceeds, immediately after the change of digital signal to the logical low level, once or twice or more, the switching level of the switching diode 21 as indicated by the crossing part of the solid line and the chain line in FIG. 4. During the period in which the logical low level is exceeding the switching level, the switching diode 21 turns ON and thereby the carrier signal is transmitted through the switching diode 21.

As explained above, the ASK modulator of the related art has a problem that it is impossible to derive an errorless ASK modulated signal at the ASK modulated signal output end 28 because the carrier signal is transmitted in the temporary ON condition of the switching diode 21 caused by the ringing phenomenon during the period where transmission of the carrier signal should be rejected.

SUMMARY OF THE INVENTION

The present invention has been proposed to solve the problem explained above and it is therefore an object of the present invention to provide an ASK modulator which can extract errorless ASK modulated signal even if the ringing phenomenon is generated when the digital signal changes from a logical high level to a logical low level.

In view of attaining the object explained above, there is provided, in the ASK modulator of the present invention, means for substantially raising the switching level of a switching diode by dividing the ASK modulator of the digital signal with a series connected first resistor and a shunt connected second resistor and supplying the divided digital signal to a switching diode.

According to this means, since the divided digital signal is supplied to the switching diode to substantially raise the switching level of the switching diode, if the ringing phenomenon in which the logical low level changes in the high and low direction immediately after the digital signal changes to the logical low level from the high level, the high level part generated by the ringing phenomenon does not exceed the switching level of the switching diode and during the period that the digital signal becomes the logical low level, the switching diode always becomes OFF not to transmit the carrier signal. Thereby, an errorless ASK modulated signal can be obtained from the ASK modulated signal output end.

In the principal embodiment of the present invention, the ASK modulator supplies the carrier signal and digital signal divided by resistor to a switching element to generate the ASK modulated signal.

In a preferred embodiment of the present invention, the ASK modulator is provided with a switching diode connected in series to a carrier signal transmitting path, a first resistor connected between one end of the switching diode and digital signal input end and a second resistor connected between one end of the switching diode and the reference potential point to divide the digital signal impressed to the digital signal input end with the first and second resistors and to turn ON and OFF the switching diode depending on the logical level of the divided digital signal to generate the ASK modulated signal.

According to the embodiment of the present invention, since the switching level of the switching diode set by the logical high level and the logical low level of the digital signal is substantially raised by supplying the carrier signal and the digital signal divided by resistor to the switching diode, even if the digital signal has changed from the logical high level to the logical low level immediately after the digital signal has changed to the logical low level from high level, the high level portion caused by the ringing phenomenon does not exceed the switching level of the switching diode and while the digital signal is in the logical low level, the switching diode turns OFF and the carrier signal is never transmitted through the switching diode. Accordingly, the errorless ASK modulated signal can be obtained from the ASK modulated signal output end.

BRIEF DESCRIPTION OF THE DRAWINGS

Other objects and advantages of the present invention will be apparent from the following detailed description of the presently preferred embodiments thereof, which description should be considered in conjunction with the accompanying drawings in which.

DESCRIPTION OF THE PREFERRED EMBODIMENT

A preferred embodiment of the present invention will be explained with reference to the accompanying drawings.

Figure 1:
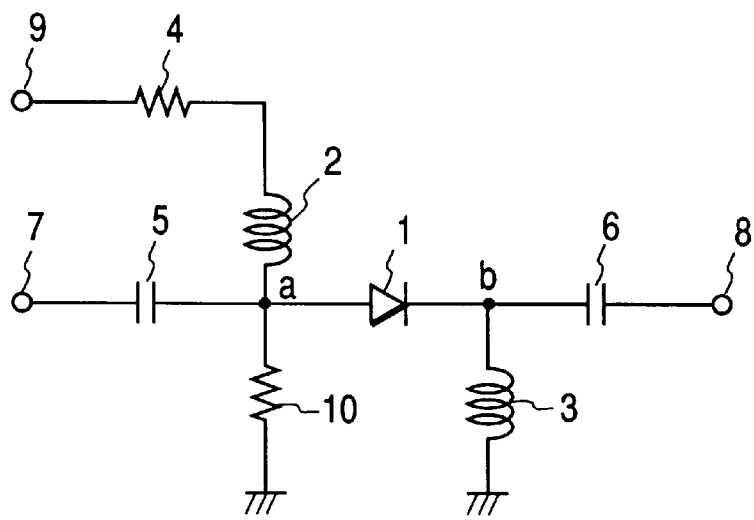
FIG. 1 is a circuit diagram showing the structure of an embodiment of the ASK modulator of the present invention.

FIG. 1 is a circuit diagram showing a structure of an embodiment of the ASK modulator of the present invention.

As shown in FIG. 1, the ASK modulator of the present embodiment is composed of a switching diode 1, a first coupling capacitor 5 connected in series between one end (input end) a of the switching diode 1 and a carrier signal input end 7, a first resistor 4 and a first choke coil 2 for rejecting a high frequency element connected in series between one end a of the switching diode 1 and a digital signal input end 9, a second resistor 10 connected between one end a of the switching diode 1 and a ground point (reference potential point), a second choke coil 3 for rejecting the high frequency element connected between the other end (output end) b of the switching diode 1 and the ground point and a second coupling capacitor 6 connected in series between the other end b of the switching diode 1 and an ASK modulated signal output end 8. In this case, the first resistor 4 and second resistor 10 act as a resistance voltage divider for the digital signal supplied to the digital signal input end 9 and the second resistor 10 is selected to have the resistance value which is considerably smaller than (the resistance value) when the switching diode 1 is turned OFF.

Difference in structure of the ASK modulator of the present invention from that of the ASK modulator of the related art is that the ASK modulator of the related art is not provided with the second resistor 10, while the ASK modulator of this embodiment is provided with the second resistor 10. There is no further difference between the ASK modulator of this embodiment and the ASK modulator of the related art.

The ASK modulator by this embodiment having the structure explained above operates as explained below.

To the carrier signal input end 7, the carrier signal is supplied, while to the digital signal input end 9, the digital signal which changes between a logical high level (this level is, for example, 5 V which is same as that of the ASK modulator of the related art) and a logical low level (this level is, for example, 0 V which is same as that of the ASK modulator of the related art).

The digital signal supplied to the digital signal input end 9 is divided by a resistance voltage divider consisting of the first resistor 4 and the second resistor 10 and the divided voltage is supplied to the input end a of the switching diode 1. When the digital signal is the logical high level signal, the logical high level signal of 5 V is divided by the resistance voltage divider consisting of the first resistor 4 and the second resistor 10 and is then supplied to the input end a of the switching diode 1 in the voltage level which is rather lower than 5 V, for example, in the voltage of 4 V, to turn ON the switching diode 1 and is then impressed to the ground point through the second choke coil 23. In this case, the carrier signal supplied to the carrier signal input end 7 is transferred to the ASK modulated signal output end 8 through the first coupling capacitor 5, the switching diode 1 in the ON condition and the second coupling capacitor 26.

Meanwhile, when the digital signal is a logical low level signal, the logical low level signal of 0 V is almost equal to the ground point voltage and the voltages at both ends of the switching diode 1 become equal. Thereby, the switching diode 1 is turned OFF. In this case, the carrier signal supplied to the carrier signal input end 7 is rejected to be transmitted by the switching diode 1 in the OFF state and is not transmitted to the ASK modulated signal output end 8.

As explained above, in the ASK modulator of this embodiment, when the digital signal shifts to the logical high level, the switching diode 1 turns ON and the carrier signal is transmitted through the switching diode 1 and when the digital signal shifts to the logical low level, the switching diode 1 turns OFF and the carrier signal is rejected by the switching diode 1. Thereby, the ASK modulated signal intermitting the carrier signal can be output from the ASK modulated signal output end 8.

Figure 2:
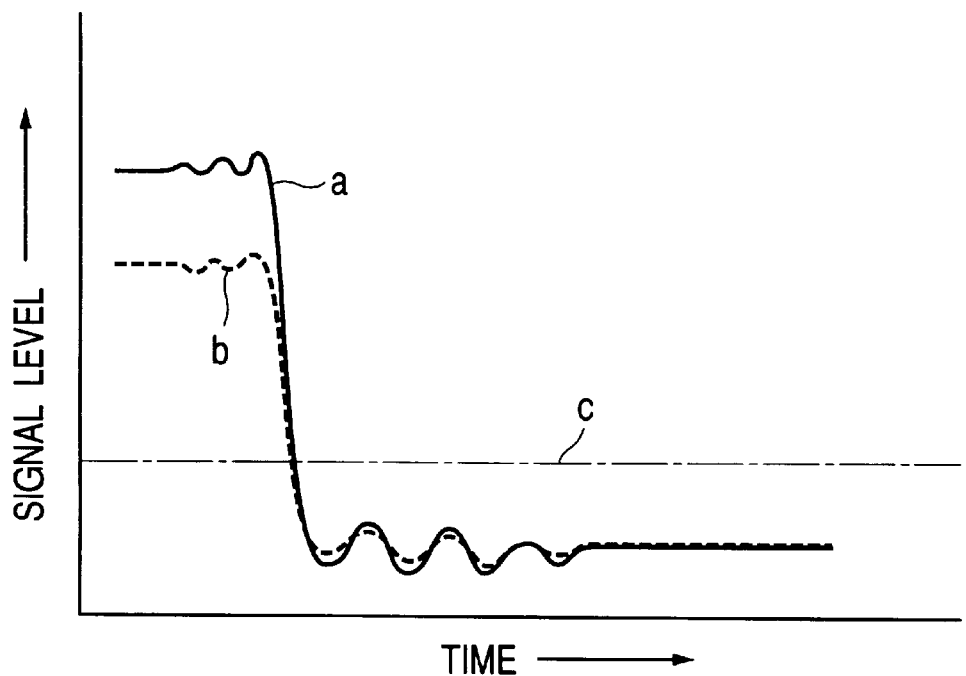
FIG. 2 is a characteristic diagram showing a relationship between the ringing phenomenon generating condition and a switching level when a digital signal has changed from a logical high level to a logical low level in the embodiment shown in FIG. 1.
Figure 3:
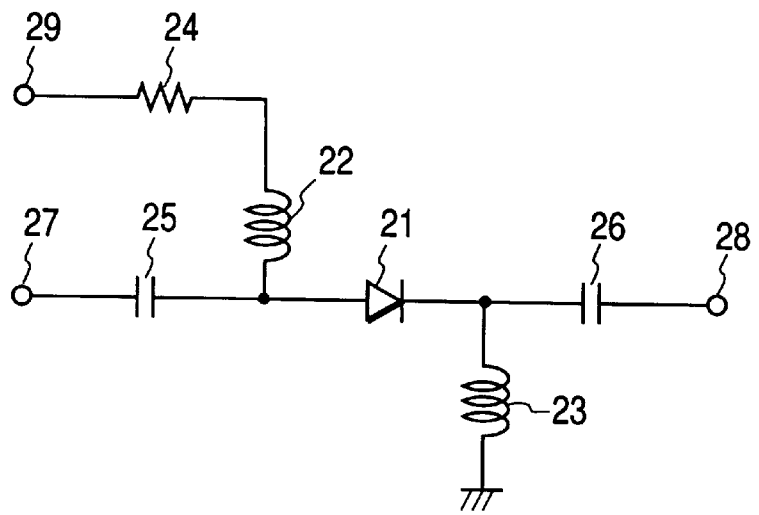
FIG. 3 is a circuit diagram showing an example of the structure of the ASK modulator of the related art.
Figure 4:
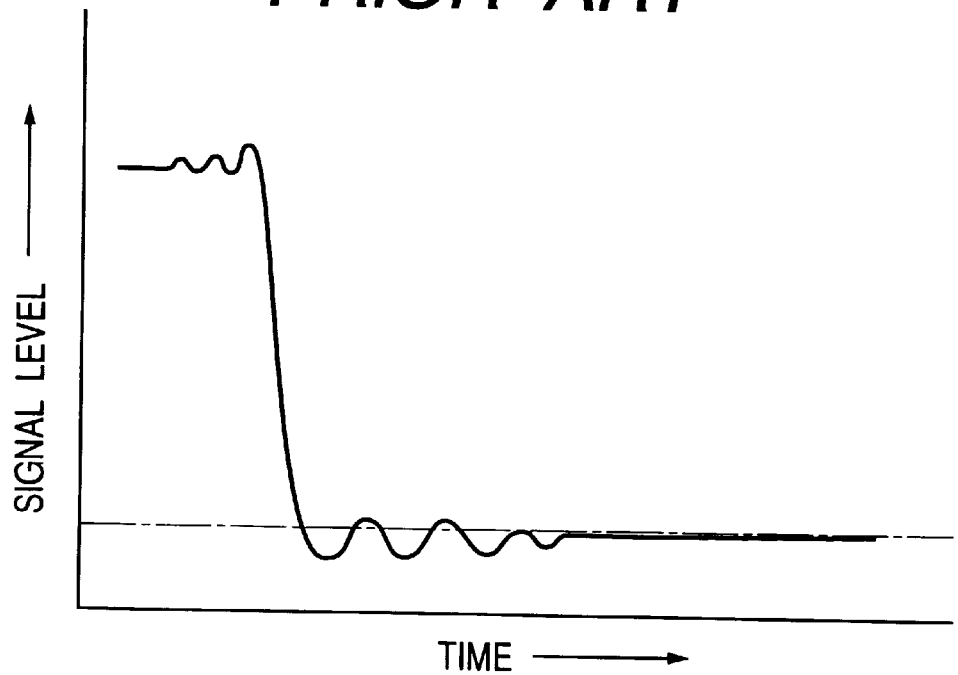
FIG. 4 is a characteristic diagram showing relationship between the ringing phenomenon generating condition and switching level when a digital signal has changed from the logical high level to the logical low level.

Here, FIG. 2 is a characteristic diagram showing the relationship between the ringing phenomenon generating condition and switching level when the digital signal has changed to the logical low level from the logical high level in the ASK modulator of this embodiment.

In FIG. 2, the vertical axis plots the signal level and the horizontal axis plots the time. A solid line (a) indicates the level change condition of the digital signal supplied to the digital signal input end 9, while a dotted line (b) indicates the level change condition of the digital signal supplied to the input end a of the switching diode 1 and a chain line (c) indicates the actual switching level of the switching diode 1.

As indicated by the solid line (a) of FIG. 2, the digital signal supplied to the digital signal input end 9 is divided by the resistance voltage divider consisting of the first resistor 2 and the second resistor 10 and is then supplied to the input end a of the switching diode 1, as indicated by the dotted line (b) of FIG. 2, under the condition that the divided digital voltage is a little attenuated than the digital signal supplied to the digital signal input terminal 9. When the digital signal changes to the logical low level from the logical high level, the ringing phenomenon same as that generated in the ASK modulator of the related art is generated immediately after such level change of the digital signal.

However, in this embodiment, since the second resistor 10 is connected between the input end a of the switching diode 1 and the ground point and a part of the current flowing into the switching diode 1, namely a comparatively small current flowing into the ground point through the switching diode 1 is not supplied to the ground point through the switching diode 1 but to the ground point through the second resistor 10 particularly when the second resistor 10 is not connected as in the case of the ASK modulator of the related art, the switching level for turning ON the switching diode 1 substantially rises, as indicated by the chain line (c) of FIG. 2, in comparison with the switching level of the ASK modulator of the related art.

Therefore, if the ringing phenomenon generated immediately after the level change of the digital signal to the logical low level from logical high level, the digital signal supplied to the input end a of the switching diode 1 does not exceed the switching level of the switching diode 1 as indicated by the dotted line (b) and the chain line (c) of FIG. 2. As a result, the switching diode 1 does not turn ON when the digital signal is in the logical low level, the carrier signal is never transmitted through the switching diode 1 and thereby errorless ASK modulated signal can always be obtained from the ASK modulated signal output end 8.

As explained previously, according to the present invention, since the switching level of the switching diode is substantially raised by supplying the carrier signal and the digital signal divided by the first and second resistors to the switching diode, even if the ringing phenomenon resulting in the level change in the high and low level direction is generated in the logical low level immediately after the digital signal has changed from the logical high level to the logical low level, the high level portion caused by the ringing phenomenon does not exceed the switching level of the switching diode and the switching diode always turns OFF while the digital signal is in the logical low level condition. Accordingly, the carrier signal is never transmitted through the switching diode and the errorless ASK modulated signal can be extracted from the ASK modulated signal output end.

What is claimed is:

1. An ASK modulator in which an ASK modulated signal is generated by supplying a carrier signal and a digital signal divided by a resistance and frequency-dependent voltage divider having a reactive component serially connected between a plurality of resistors; wherein said reactive component is connected serially to an input of a switching element that blocks current flow through the switching element when the switching element is reverse biased.

2. An ASK modulator comprising: a switching diode connected in series to a carrier signal transmitting path; a first resistor and a reactive component connected in series between one end of said switching diode and a digital signal input end; and a second resistor connected between one end of said switching diode and a reference voltage point, wherein the digital signal impressed to said digital signal input end being divided with said first and second resistors and said reactive component, and wherein said switching diode being in a conducting state only when forward-biased and wherein said conducting state depends on the logical level of a frequency-dependent divided digital signal to generate the ASK modulated signal.

3. An ASK modulator in which an ASK modulated signal is generated by supplying a carrier signal and a digital signal divided by a resistance and a frequency-dependent voltage divider comprising an inductor connected in series between a plurality of resistors and having an output directly coupled to an input of a switching element, said switching element being in a conducting state only when forward-biased, and wherein said carrier signal is divided by a second frequency-dependent voltage divider having an output directly coupled to said input of said switching element.

4. An ASK modulator comprising: a switching diode connected in series to a carrier signal transmitting path; a first resistor and an inductor connected in series between an input end of said switching diode and a digital signal input end; and a second resistor connected between said input end of said switching diode and a reference voltage point, wherein a digital signal is coupled to said digital signal input end and is divided by said first and second resistors and said inductor, and said switching diode being in a conducting state only when forward-biased, in which said conducting state depends on the logical level of the divided digital signal to generate the ASK modulated signal.

\* \* \* \* \*